United States Patent [19]

Harasawa

[11] Patent Number: 5,546,221
[45] Date of Patent: Aug. 13, 1996

[54] OPTICAL AMPLIFIER APPARATUS

[75] Inventor: Shinichiro Harasawa, Kawasaki, Japan

[73] Assignee: Fujitsu Limited, Japan

[21] Appl. No.: 425,342

[22] Filed: Apr. 18, 1995

Related U.S. Application Data

[63] Continuation of Ser. No. 26,443, Mar. 4, 1993.

[30] Foreign Application Priority Data

Mar. 6, 1992 [JP] Japan .................................. 4-049464

[51] Int. Cl.$^6$ .............................. G02F 1/39; H04B 10/06; H01S 3/06
[52] U.S. Cl. .............................. 359/341; 359/187; 372/38
[58] Field of Search .................................. 359/133, 160, 359/177, 187, 337, 341, 345; 372/6, 38, 75

[56] References Cited

U.S. PATENT DOCUMENTS

| | | | |
|---|---|---|---|
| 4,716,569 | 12/1987 | Bees | 372/38 |
| 4,886,334 | 12/1989 | Oaki | 359/341 |
| 5,054,876 | 10/1991 | Grosso et al. | 359/345 |
| 5,138,621 | 8/1992 | Goto et al. | 372/6 |
| 5,268,786 | 12/1993 | Matsushita et al. | 359/341 |

FOREIGN PATENT DOCUMENTS

| | | |
|---|---|---|
| A2048905 | 3/1990 | European Pat. Off. . |
| 567280 | 10/1993 | European Pat. Off. . |
| 59-215133 | 12/1984 | Japan . |
| 1-149496 | 6/1989 | Japan . |
| 4-3029 | 1/1992 | Japan . |
| 4165334 | 5/1992 | Japan . |

*Primary Examiner*—Nelson Moskowitz
*Attorney, Agent, or Firm*—Greer, Burns & Crain, Ltd.

[57] ABSTRACT

An optical amplifier apparatus using an optical amplifying fiber including a working laser and a stand-by laser for firing pumping light to the optical amplifying fiber through an optical coupler, a signal light monitor unit which splits off part of the output signal light of the optical amplifying fiber by the optical coupler and monitors the same, a drive current monitor unit which monitors the drive current of the working laser, and a supervisory unit which judges that the working laser has deteriorated or there is a fault in the driver circuit of the working laser and switches from the working laser to the stand-by laser to generate the pumping light when the monitor output signal of the drive current monitor unit rises or falls beyond a predetermined range and the monitor output signal of the signal light monitor unit falls below a predetermined value. The level of the output signal light is also referred to in judging the deterioration of the laser for generating the pumping light.

7 Claims, 9 Drawing Sheets

5,546,221

OPTICAL AMPLIFIER APPARATUS

RELATED APPLICATION

This is a continuation of copending application Ser. No. 08/026,443, filed on Mar. 4, 1993.

BACKGROUND OF THE INVENTION

1. Field of the Invention

The present invention relates to an optical amplifier apparatus using an optical amplifying fiber.

There is known an optical amplifier apparatus including an optical amplifying fiber which directly amplifies optical signals. This optical amplifier apparatus is provided with a laser for producing pumping light. If the laser deteriorates, the input signal light cannot be amplified to the predetermined level. Therefore, the construction is employed where a stand-by laser is provided and that stand-by laser is switched to when the working laser deteriorates.

2. Description of the Related Art

An optical amplifying fiber generally is comprised of $SiO_2$-$GeO_2$ as a host glass to which is doped erbium (Er) and has an amplifiable wavelength band of 1.55 µm. Therefore, since this matches with the minimum loss wavelength band of the quartz optical fiber used for usual optical signal transmission, this is applied to the optical amplifier apparatus in an optical signal transmission system. The wavelength of the pumping light may be made 0.51 µm, 0.66 µm, 0.81 µm, 0.98µ, and 1.48 µm, so there is known a construction where a semiconductor laser of a 0.98 µm or 1.48 µm band is used as the pumping light source of the erbium-doped optical amplifying fiber. Further, there is known a construction wherein aluminum (Al) or phosphorus (P) doped $AL_2O_3$-$GeO_2$-$SiO_2$ or $Al_2O_3$-$P_2O_5$-$GeO_2$-$SiO_2$ is used as the host glass and erbium is doped. Note that there is also known a construction wherein neodium (Nd), praseodymium (Pr), and other rare earth elements are doped instead of erbium.

The conventional optical amplifier apparatus using this optical amplifying fiber, as explained in detail later with respect to FIG. 1, includes an optical amplifying fiber, a working laser, a stand-by laser, a signal light monitor circuit, a drive current monitor circuit, laser driver circuits, photocouplers, an input optical fiber, an output optical fiber, and a photodiode for monitoring the output signal light.

Here, the above-mentioned drive current monitor circuit transforms the drive current of the working laser given by the laser driver circuit into voltage through resistors etc. and monitors the result. When the working laser deteriorates, there is a tendency for an increase of the drive current, so if the drive current of the working laser exceeds a predetermined value, it is decided that the working laser has deteriorated. The laser driver circuit of the stand-by laser is then placed in the active state, and the operation of the laser driver circuit of the working laser is stopped, whereby the working and stand-by systems are switched.

Note that as a similar technique for judging the above deterioration, in the normal Optical signal stabilization structure where the backward output light of the semiconductor laser is monitored and the optical output of the semiconductor laser is stabilized based on the results, the semiconductor laser may be judged to have deteriorated when the drive current of the semiconductor laser exceeds a set value. For example, this is disclosed in Japanese Unexamined Patent Publication (Kokai) No. 59-215133.

As mentioned above, in the prior art, a laser was judged as having deteriorated by the rise of the drive current. Therefore, there was the defect that when the drive current of the laser became zero or fell remarkably due to a fault or line disconnection of the laser driver circuit, the laser was judged normal. Further, when the input signal light level fell by a large amount, it was necessary to make the pumping light power larger, so there were cases where the drive current of the laser would exceed a predetermined value. In those cases, there was the defect of a mistaken judgement as to laser deterioration.

SUMMARY OF THE INVENTION

Therefore, the present invention, in consideration of the above defects, has as its object the provision of an optical amplifier apparatus which enables correct switching between the working and stand-by systems by accurately and faithfully supervising the deterioration of the working laser.

According to the present invention, there is provided an optical amplifier apparatus including an optical amplifying fiber, firing input signal light and pumping light into the optical amplifying fiber, and amplifying the input signal light, comprising a working laser which outputs the pumping light; one or more standby lasers which are used in place of the working laser; a signal light monitor unit which splits part of the output signal light optically amplified by the optical amplifying fiber and monitors the intensity of the same; a drive current monitor unit which monitors the magnitude of the drive current for driving the working laser; and a supervisory means which receives both of a first monitor output from the signal light monitor unit and a second monitor output from the drive current monitor unit and produces a working/stand-by switching command signal between the working laser and the stand-by laser in accordance with the first and second monitor outputs.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the prior art and the problems therein will be first described with reference to the related figures.

Figure 1:
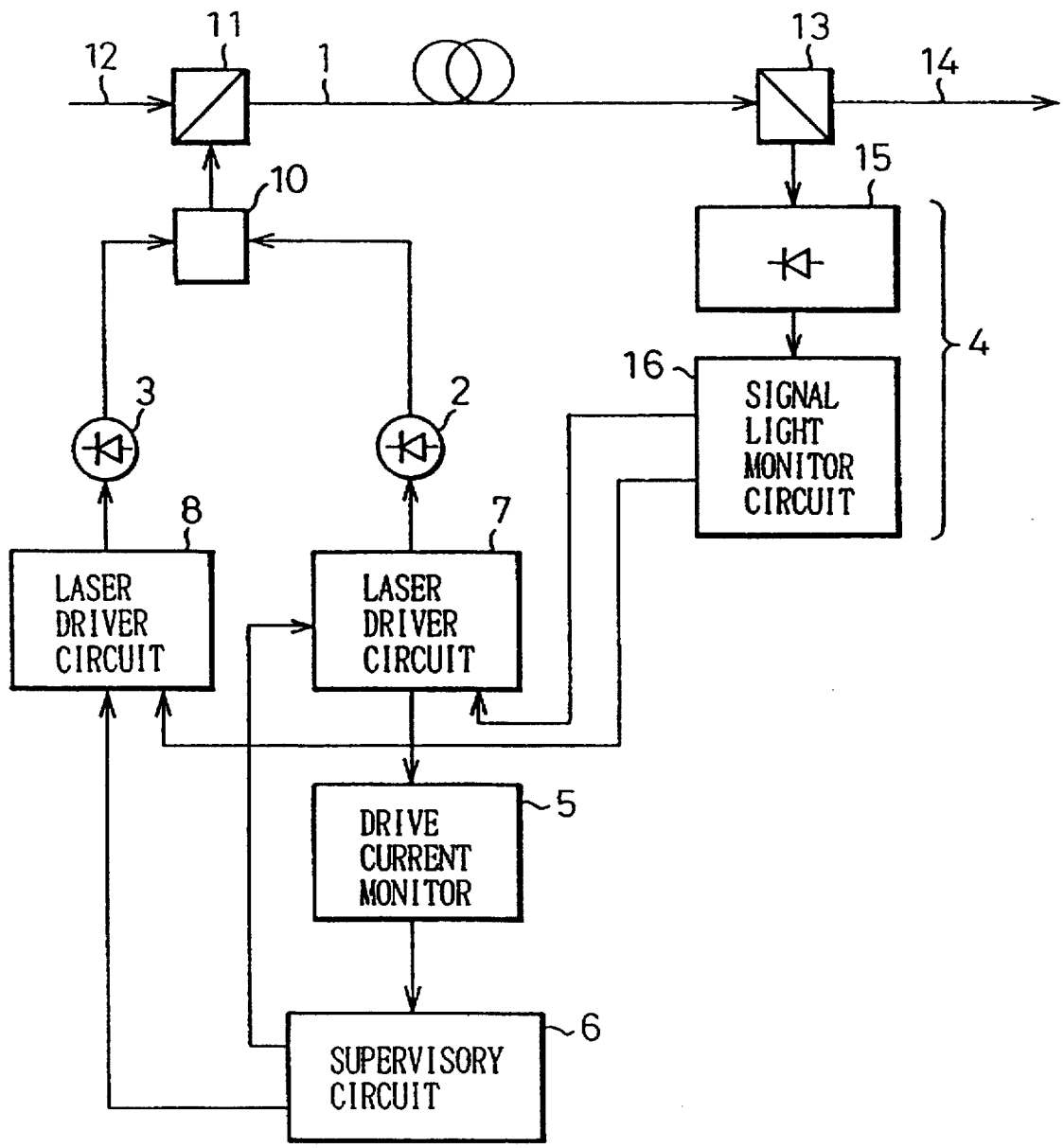
FIG. 1 is a block diagram showing an example of a conventional optical amplifier apparatus.

FIG. 1 is a block diagram showing an example of a conventional optical amplifier apparatus. In FIG. 1, reference numeral 1 is an optical amplifying fiber, 2 is a working laser, 3 is a stand-by laser, 4 is a signal light monitor unit, 5 is a drive curent monitor unit, 8 and 7 are laser driver circuits, 10, 11, and 13 are optical couplers, 12 is an input light fiber, 14 is an output light fiber, 15 is a photodiode for monitoring the output signal light, and 6 is a supervisory circuit. The case of forward pumping is shown. This forward pumping construction has the advantage of lower noise than the backward pumping construction.

The input signal light of a wavelength, for example, of 1.55 μm, fired from the input optical fiber 12 through the output coupler 11 to the optical amplifying fiber 1 is pumped and amplified by pumping light of a wavelength of, for example, 0.98 μm fired from a working laser 2 using a semiconductor laser etc. through the optical couplers 10 and 11 to the optical amplifying fiber 1. The amplified signal light is supplied to the later optical transmission path or optical signal apparatus from the output fiber 14. Part of the amplified output signal light is split by the optical coupler 13 and fired into a photodiode 15. The laser driver circuits 7 and 8 are controlled by the signal light monitor circuit 16 so that the output signal of the photodiode 15 becomes a predetermined level. At that time, the laser driver circuit 7 of the working laser 2 is placed in an active state by the command of the supervisory circuit 6, so the pumping light is output from the working laser 2.

The drive current monitor circuit 5 transforms the drive current of the working laser 2 from the laser driver circuit 7 into voltage through resistors etc. and monitors the same. If the working laser 2 deteriorates, there is a tendency for an increase of the drive current, so if the drive current of the working laser 2 exceeds a predetermined value, it is decided that the working laser 2 has deteriorated, the laser driver circuit 8 of the stand-by laser 3 is placed in the active state, and the operation of the laser driver circuit 8 of the working laser 2 is stopped, whereby the working and stand-by systems are switched.

In this way, in the prior art, a laser was judged as having deteriorated by the rise of the drive current. Therefore, there was the defect that when the drive current of the laser became zero or fell remarkably due to a fault or line disconnection of the laser driver circuit, the laser was judged normal. Further, when the input signal light level fell by a large amount, it was necessary to make the pumping light power larger, so there were cases where the drive current of the laser would exceed a predetermined value. In those cases, there was the defect of a mistaken judgement as to laser deterioration.

To eliminate these defects, the optical amplifier apparatus of the present invention is constituted as described in detail below.

Figure 2:
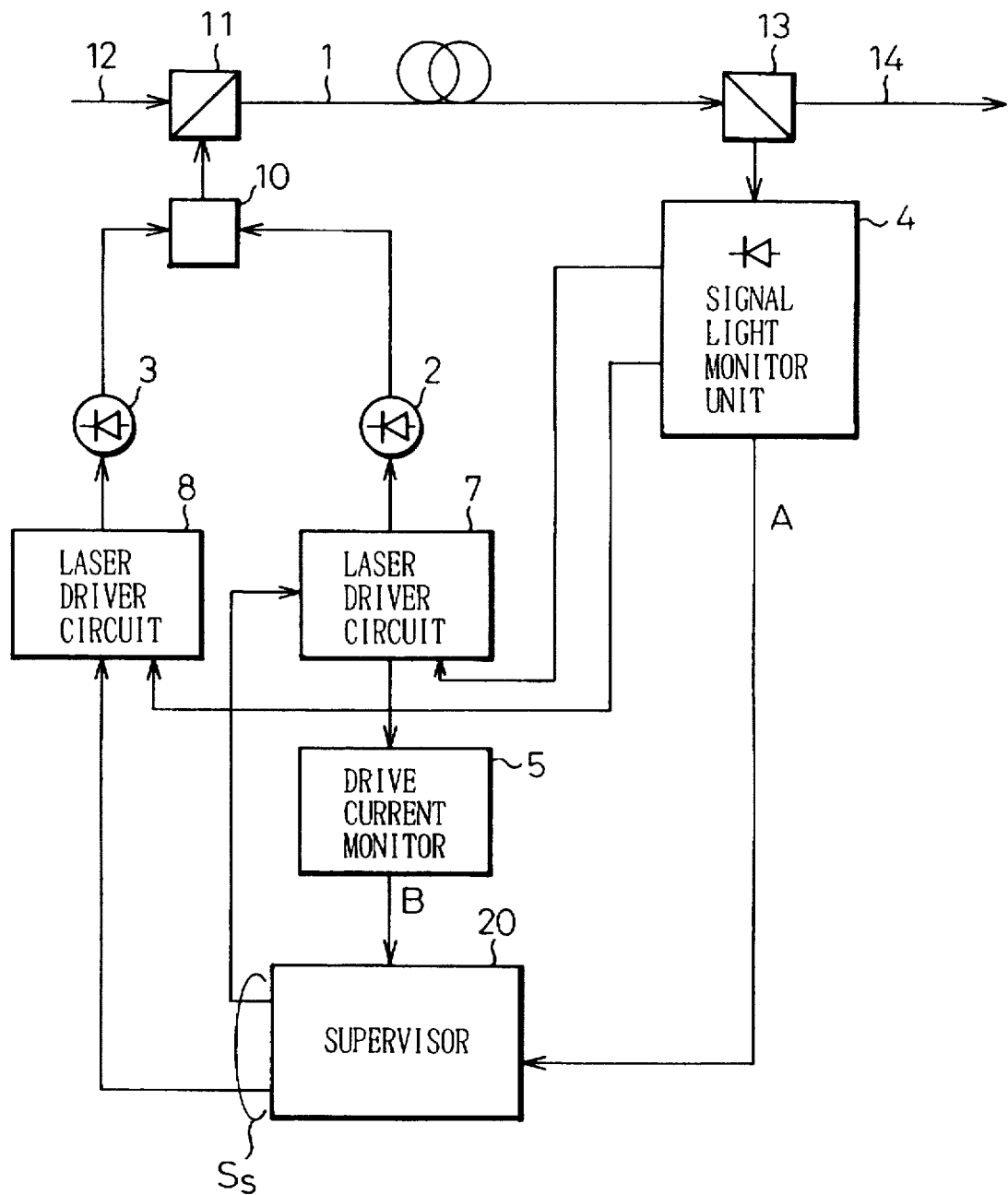
FIG. 2 is a block diagram showing the basic constitution of the optical amplifier apparatus according to the present invention.

FIG. 2 is a block diagram showing the basic constitution of the optical amplifier apparatus according to the present invention. Note that throughout the figures, similar constituent elements are shown with the same reference numerals or symbols. In FIG. 2, the optical amplifier apparatus of the present invention has the following general constitution: a working laser 2 which outputs the pumping light; one or more stand-by lasers 3 which are used in place of the working laser; a signal light monitor unit 4 which splits part of the output signal light optically amplified by the optical amplifying fiber 1 and monitors the intensity of the same; a drive current monitor unit 5 which monitors the magnitude of the drive current for driving the working laser; and a supervisory means 20 which receives both of a first monitor output from the signal light monitor unit 4 and a second monitor output from the drive current monitor unit 5 and produces a working/stand-by switching command signal between the working laser 2 and the stand-by laser 3 in accordance with the first and second monitor outputs.

Note that there need not be only one system including the stand-by laser 3. A plurality of them may be provided, but this should not be understood as a characteristic feature of the present invention. The most essential part of the present invention is the above supervisory means 20. More specifically, the supervising means 20 is operative to produce the working/stand-by switching command signal S when it detects that the first monitor output falls below a first threshold ($TH_1$) and the second monitor output becomes larger than a second threshold ($TH_2$) or smaller than a third threshold ($TH_3$: $TH_2 > TH_3$).

The operation is as follows:

The input signal light from the input optical fiber 12 is fired through the optical coupler 11 to the optical amplifying fiber 1. The pumping light through the optical couplers 10 and 11 from the working laser 2 is fired into the optical amplifying fiber 1. The output signal light amplified by the optical amplifying fiber 1 is sent through the output optical fiber 14 to the optical transmission line. Further, part of the output signal light is split off and input to the signal light monitor unit 4. The supervisory means 20 places the driver circuit 7 of the working laser 2 in the active state and, when the working laser 2 deteriorates, makes the driver circuit 8 of the stand-by laser 3 operate.

When the working laser 2 is normal, the monitor output A from the signal light monitor unit 4 maintains a predetermined level. Also, the monitor output B from the drive current monitor unit 5 becomes a level within a predetermined range. If the working laser 2 deteriorates, the pumping light power drops and the gain of the optical amplifying fiber 1 drops, so the level of the monitor output A from the signal light monitor unit 4 falls below a predetermined level and the level of the monitor output B from the drive current monitor unit 5 rises and exceeds a predetermined range. The supervisory means 20, when detecting this state based on the monitor outputs A and B, judges that the working laser 2 has deteriorated, starts the operation of the driver circuit 8, stops the driver circuit 7, and thus switches the working and stand-by systems.

When the input signal light level falls by an extreme amount, the drive current of the working laser 2 rises so that the gain of the optical amplifying fiber 1 becomes maximized. At this time, the monitor output B from the drive current monitor unit 5 rises and exceeds the predetermined range. If the signal light is amplified to the predetermined level by the optical amplifying fiber 1, the monitor output A from the signal light monitor unit 4 falls from the predetermined value, so the supervisory means 20 does not judge that the working laser 2 has deteriorated even if the drive current of the working laser 2 rises. Therefore, the working and stand-by systems are not switched.

If the drive current falls to zero or an extreme amount due to a fault in the driver circuit 7 of the working laser 2, the gain of the optical amplifying fiber 1 also falls. The level of the monitor output A of the signal light monitor unit 4 also falls. When it drops below a predetermined value, the supervisory means 20 judges that the working laser 2 has deteriorated or there is a fault in the driver circuit 7 and thus switches the working and stand-by systems.

Figure 3:
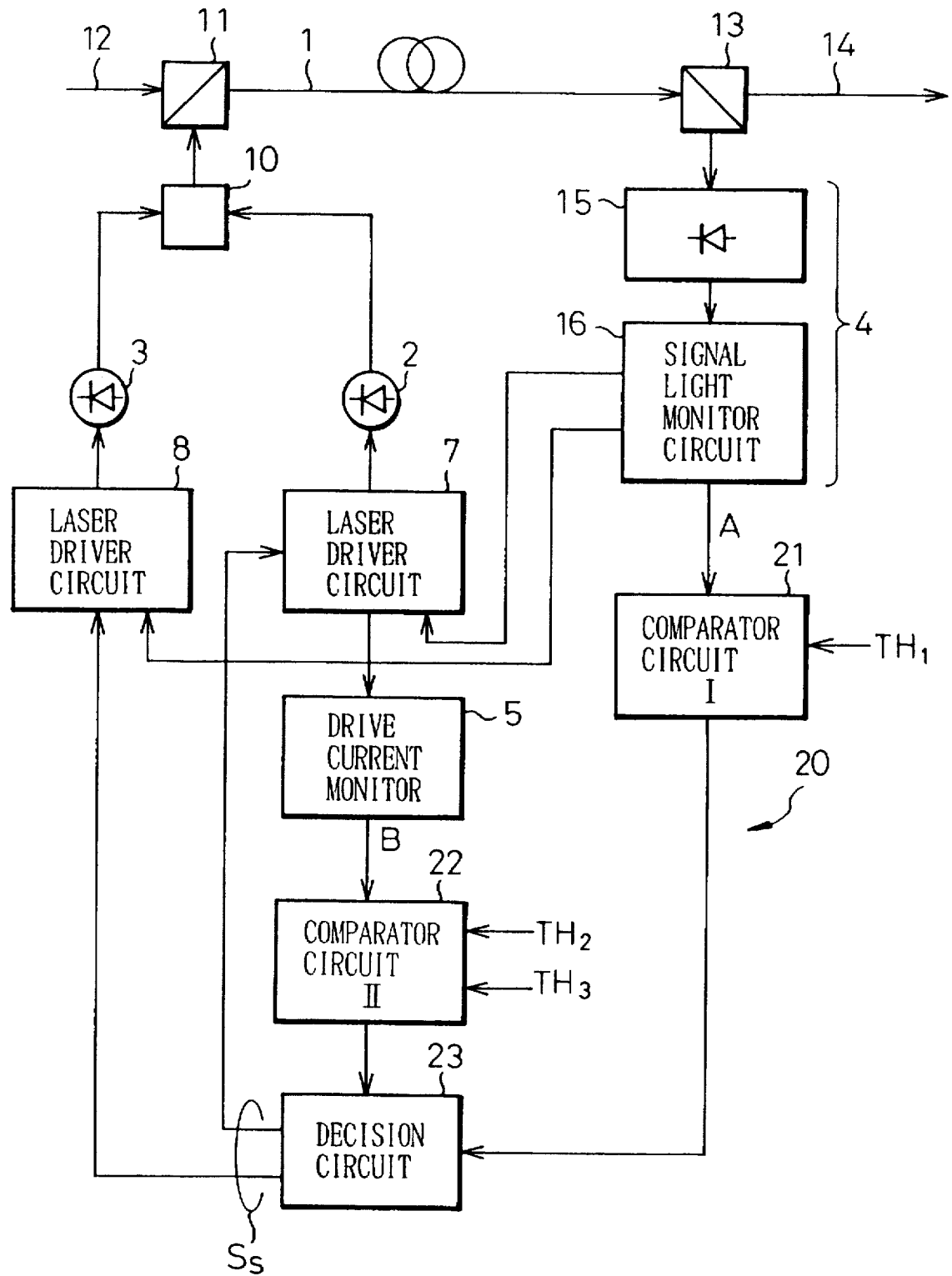
FIG. 3 is a block diagram showing an embodiment of the optical amplifier apparatus according to the present invention.

FIG. 3 is a block diagram showing an embodiment of the optical amplifier apparatus according to the present invention. As shown in the figure, the characteristic feature of the present invention, the supervisory means 20, is comprised of a first comparator circuit 21 which receives as one input the first threshold ($TH_1$) and as another input the first monitor output A, a second comparator circuit 22 which receives as one input the second threshold ($TH_2$) and the third threshold ($TH_3$) and receives as another input the second monitor output B, and a decision circuit 23 which receives as input information the results of comparison from the first and second comparator circuits 21 and 22 and issues the working/stand-by switching command signal $S_S$ according to the input information.

Note that this embodiment also shows the case of forward pumping in the same way as the prior art example shown in FIG. 1.

The input signal light fired from the input optical fiber 12 through the output coupler 11 to the optical amplifying fiber 1 is pumped and amplified by pumping light fired from a working laser 2 through the optical couplers 10 and 11 to the optical amplifying fiber 1. The amplified output signal light is sent through the output light fiber 14 to the later apparatus or optical transmission path. Part of the output signal light is split by the optical coupler 13 and fired into a photodiode 15. The signal light monitor circuit 16 transforms the current flowing in the photodiode 15 to voltage through resistors etc. and uses the result as the monitor output A. The laser driver circuits 7 and 8 are controlled by the signal light monitor circuit 16 so that the output signal of the photodiode 15 becomes a predetermined level. At that time, since use is made of pumping light from the working laser 2, the laser driver circuit 7 is switched to an active state by the command of the decision circuit 23, while the laser driver circuit 8 on the stand-by laser 3 side is switched to the idle state.

The drive current monitor unit 5 transforms the current supplied from the laser driver circuit 7 to the working laser 2 into voltage through the resistors etc. and uses the result as the monitor output B. The monitor output B is applied to the second comparator circuit 22. This comparator circuit 22 compares if there is a monitor output B in the range from the upper limit $TH_2$ and the lower limit $TH_3$. The signal of the result of the comparison is applied to the decision circuit 23. The first comparator circuit 21 compares the monitor output A from the signal light monitor circuit 16 and the threshold $TH_1$. The result of the comparison is applied to the decision circuit 23. Note that $TH_1$, $TH_2$, and $TH_3$ are determined in advance by the designer as the conditions for ensuring the constant amplification of the input signal light of a predetermined dynamic range.

When everything is positive, the comparison result signal of $A \geq TH_1$ from the comparator circuit 21 is applied to the decision circuit 23, further, the comparison result signal of $TH_2 \geq B \geq TH_3$ from the comparator circuit 22 is applied to the decision circuit 23. Therefore, the decision circuit 23 selects the laser driver circuit 7 and operates the same so as to drive the working laser 2. Further, when the comparison result signal mentioned above from the comparator circuit 21 is applied to the decision circuit 23 and the comparison result signal of $TH_2<B$ from the comparator circuit 22 is applied to the decision circuit 23, the level of the input signal is low or the working laser 2 has started to deteriorate, but there is still no need to switch to the stand-by laser 3. Therefore, the working and stand-by systems are not switched. Further, when the above-mentioned comparison result signal from the comparator circuit 21 is applied to the decision circuit 23 and the comparison result signal $B<TH_3$ from the comparator circuit 22 is applied to the decision circuit 23, the level of the input signal light is high and therefore the working and stand-by systems are not switched.

When the comparison result signal of $A<TH_1$ from the comparator circuit 21 is applied to the decision circuit 23 and the comparison result signal of $TH_2 \geq B \geq TH_3$ from the comparator circuit 22 is applied to the decision circuit 3, the level of the output signal light falls below the predetermined value, but the drive current of the working laser 2 is in the normal range, so it is judged that this is due to an abnormality inside the signal light monitor circuit 16. The working and stand-by systems are not switched. However, when the comparison result signal of $TH_2<B$ from the comparator circuit 22 is applied to the decision circuit 23, it means the working laser 2 has deteriorated and the drive current has risen over the predetermined range, so the decision circuit 23 stops the operation of the laser driver circuit 7 and instead starts the operation of the laser driver circuit 8 so as to supply a drive current to the stand-by laser 3 and generate pumping light. That is, the working and stand-by systems are switched.

When the comparison result signal of $A<TH_1$ from the comparator circuit 21 is applied to the decision circuit 23 and the comparison result signal of $B<TH_2$ from the comparator circuit 22 is applied to the decision circuit 23, the decision circuit 23 judges that there is a fault in the working laser or the laser driver circuit 7 and the working and stand-by systems are switched.

Summarizing the first and second comparator circuits 21 and 22, the first comparator circuit 21 is operative to output a first logic or a second logic in accordance with whether the first monitor output A is over the first threshold ($TH_1$), while the second comparator circuit 22 is operative to output a first logic or a second logic in accordance with whether the second monitor output B is between the second threshold ($TH_2$) and the third threshold ($TH_3$). If illustrated, the result becomes as shown in FIG. 4A and FIG. 4B.

Figure 4A:
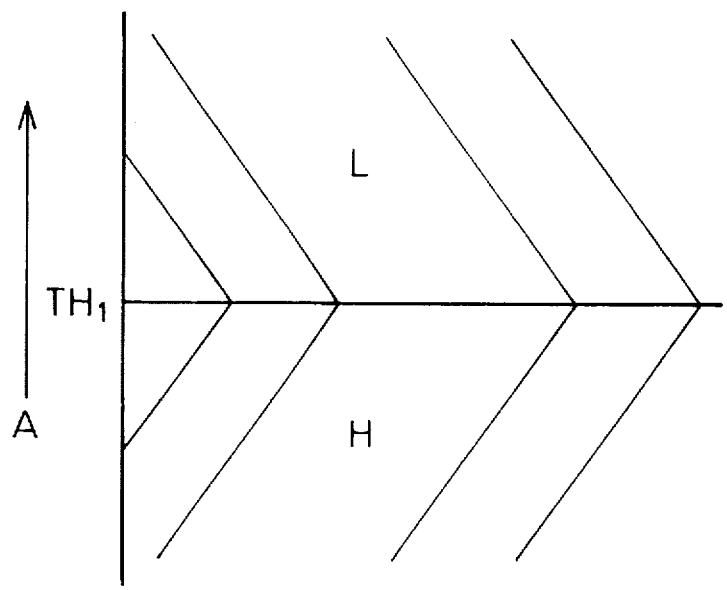
FIG. 4A is a view of the output logic of a first comparator circuit.
Figure 4B:
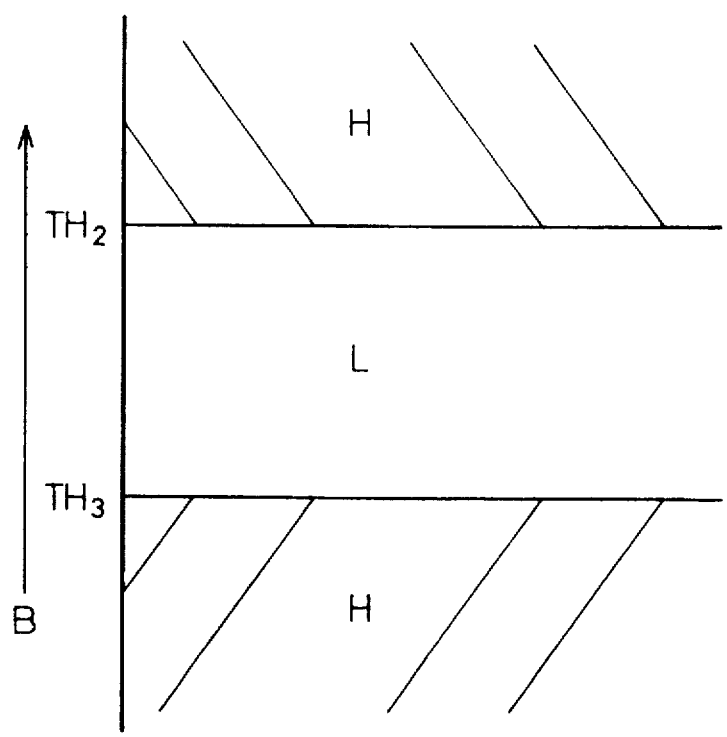
FIG. 4B is a view of the output logic of a second comparator circuit.

FIG. 4A is a view of the output logic of a first comparator circuit, and FIG. 4B is a view of the output logic of a second comparator circuit.

Referring to FIG. 4A, when the first monitor output A exceeds the first threshold $TH_1$, the output of the comparator circuit 21 assumes the above first logic (L (low) in the figure). When it falls below $TH_1$, it assumes the second logic (H (high) in the figure).

Referring to FIG. 4B, when the second monitor output B is between the second threshold $TH_2$ and the third threshold $TH_1$, the output of the comparator circuit 22 assumes the first logic (L), while when it is outside of $TH_2$ and $TH_3$, it assumes the second logic (H).

Summarizing the above explanation of the operation, only when the first comparator circuit 21 outputs the logic L of FIG. 4A and simultaneously the second comparator circuit 22 outputs the logic L of FIG. 4B is the working laser 2 judged to be normal. Only when the first comparator circuit 21 outputs the logic H of FIG. 4A and simultaneously the second comparator circuit 22 outputs the logic H of FIG. 4B is it judged that the working laser 2 has truly deteriorated. In the latter judgement, the working/stand-by switching command signal $S_S$ is sent out from the supervisory means 20.

Figure 5A:
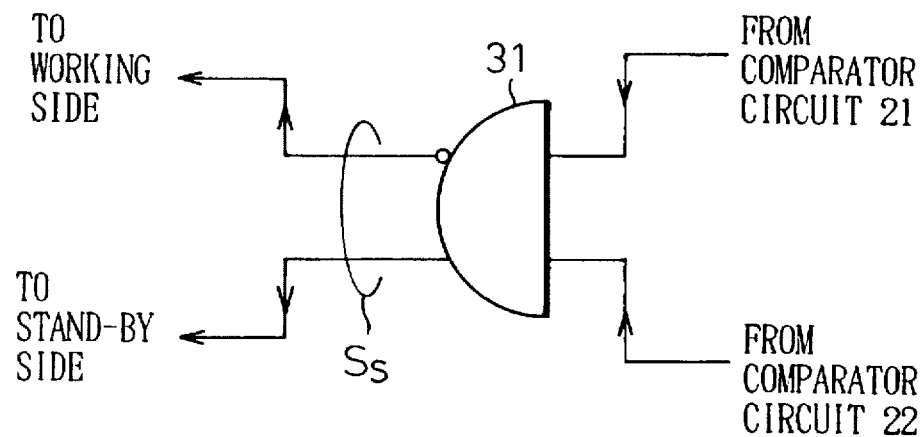
FIG. 5A is a view showing a specific example of a decision circuit.
Figure 5B:
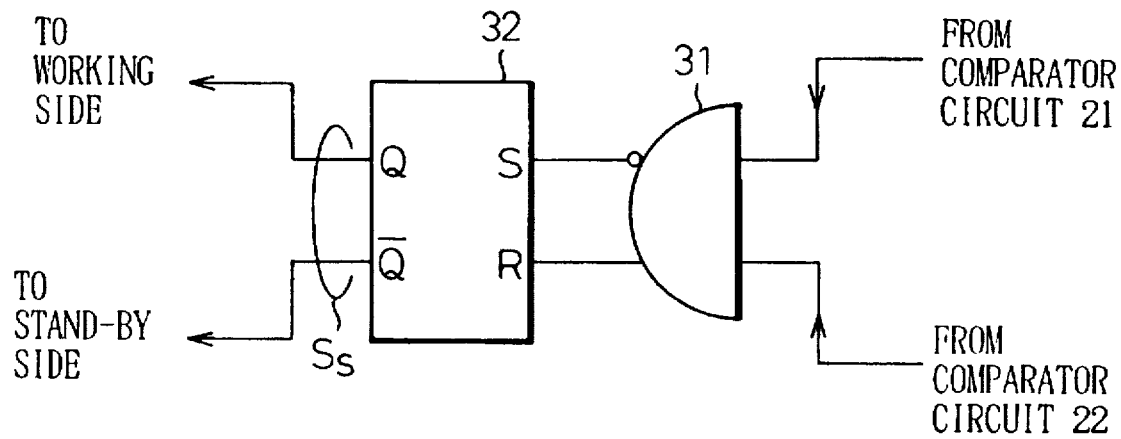
FIG. 5B is a view showing a modification of the decision circuit of FIG. 5A.

FIG. 5A is a view showing a specific example of a decision circuit, and FIG. 5B is a view showing a modification of the decision circuit of FIG. 5A. As shown in FIG. 5A, the decision circuit 23 can be simply comprised of an AND circuit 31. That is, the decision circuit 23 is composed of an AND circuit which receives as a first input the first logic L or second logic H from the first comparator circuit 21 and receives as a second output the first logic L or second logic H from the second comparator circuit 22 and sends the working/stand-by switching command signal $S_S$ by the output of the AND circuit 31.

When there is the chance of a change in the output signal $S_S$ of the decision circuit 23 comprised of just the AND circuit 31 of FIG. 5A due to noise etc., a flip-flop 32 is provided at the output stage of the AND circuit 31.

Figure 6:
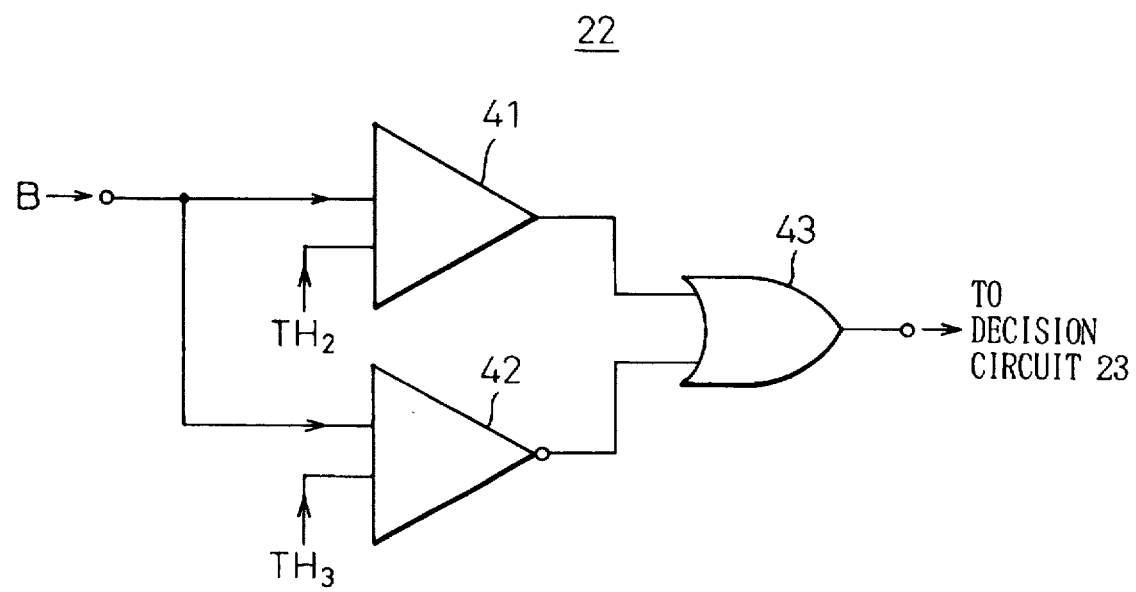
FIG. 6 is a circuit diagram showing a specific example of the second comparison circuit.

FIG. 6 is a circuit diagram showing a specific example of the second comparison circuit. The second comparator circuit 22 is composed of a first comparator 41 which receives as one input the second threshold ($TH_2$), a second comparator 42 which receives as one input the third threshold ($TH_3$), and an OR circuit 43, the second monitor output B is received in common at the other inputs of the first and second comparators 41 and 42, and the OR circuit 43 receives as its input the outputs of the first and second comparators 41 and 42 and gives its output to the decision circuit 23.

Figure 7:
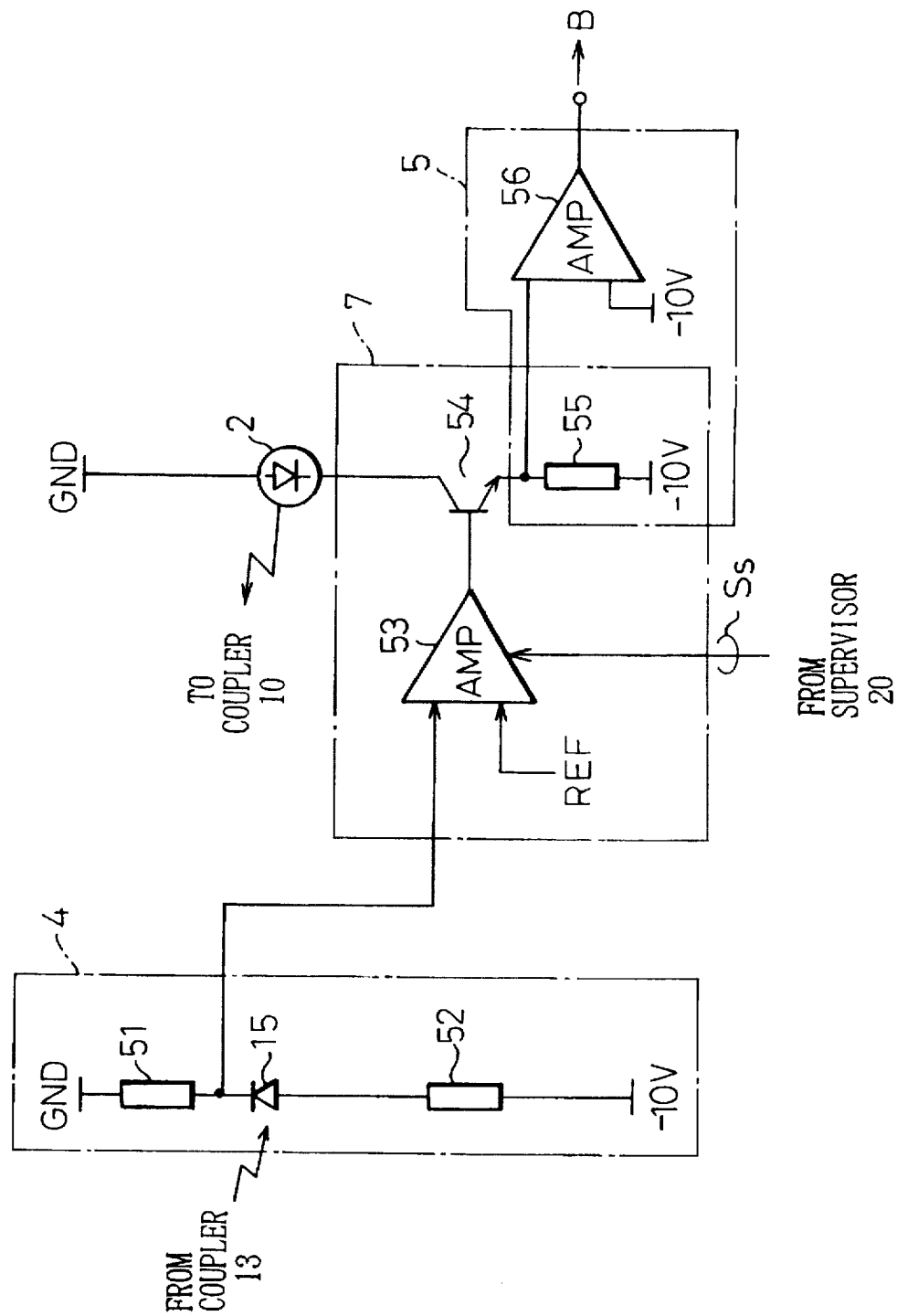
FIG. 7 is a view showing a detailed example of the signal light monitor unit 4, the laser driver circuit 7, the working laser 2, and the drive current monitor unit 5.

FIG. 7 is a view showing a detailed example of the signal light monitor 4, the laser driver circuit 7, the working laser 2, and the drive current monitor 5. The working/stand-by switching command signal $S_S$ from the supervisory means 20, a main component of the present invention, is applied to the amplifier 53 in the figure. When switching to stand-by, the signal $S_S$ deenergizes the amplifier 53.

In FIG. 7, reference numerals 51, 52, and 55 show resistors, while reference numerals 53, 54, and 56 show amplifiers.

Figure 8:
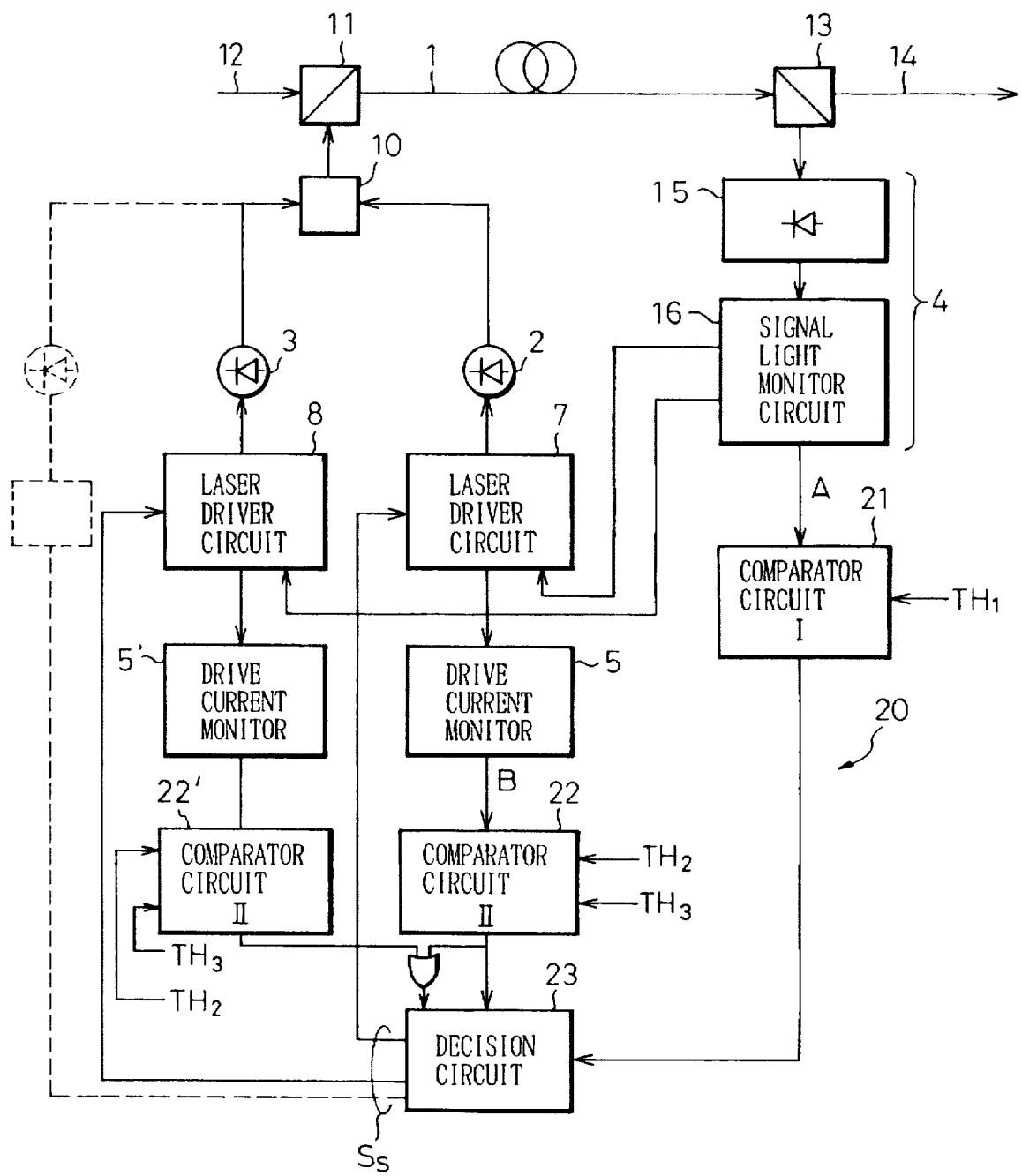
FIG. 8 is a view showing an example where the stand-by laser side is constituted in the same way as the working laser side.

FIG. 8 is a view showing an example where the stand-by laser side is constituted in the same way as the working laser side. A stand-by side drive current monitor 5' and stand-by side second comparator circuit 22' having the same constructions as the drive current monitor 5 and the second comparator circuit 22 provided at the working side, respectively, are connected to the stand-by laser driver circuit 8 as well. In the state where the stand-by laser 3 side is switched to due to the deterioration of the working laser 2, the working laser 2 is replaced with a new unit. Then, when the stand-by laser 3 now in use deteriorates, the new laser 2 is placed into service.

Note that the stand-by laser 3 is not limited to a single system. Several systems may be provided as shown by the dotted lines at the left side of FIG. 8.

Figure 9:
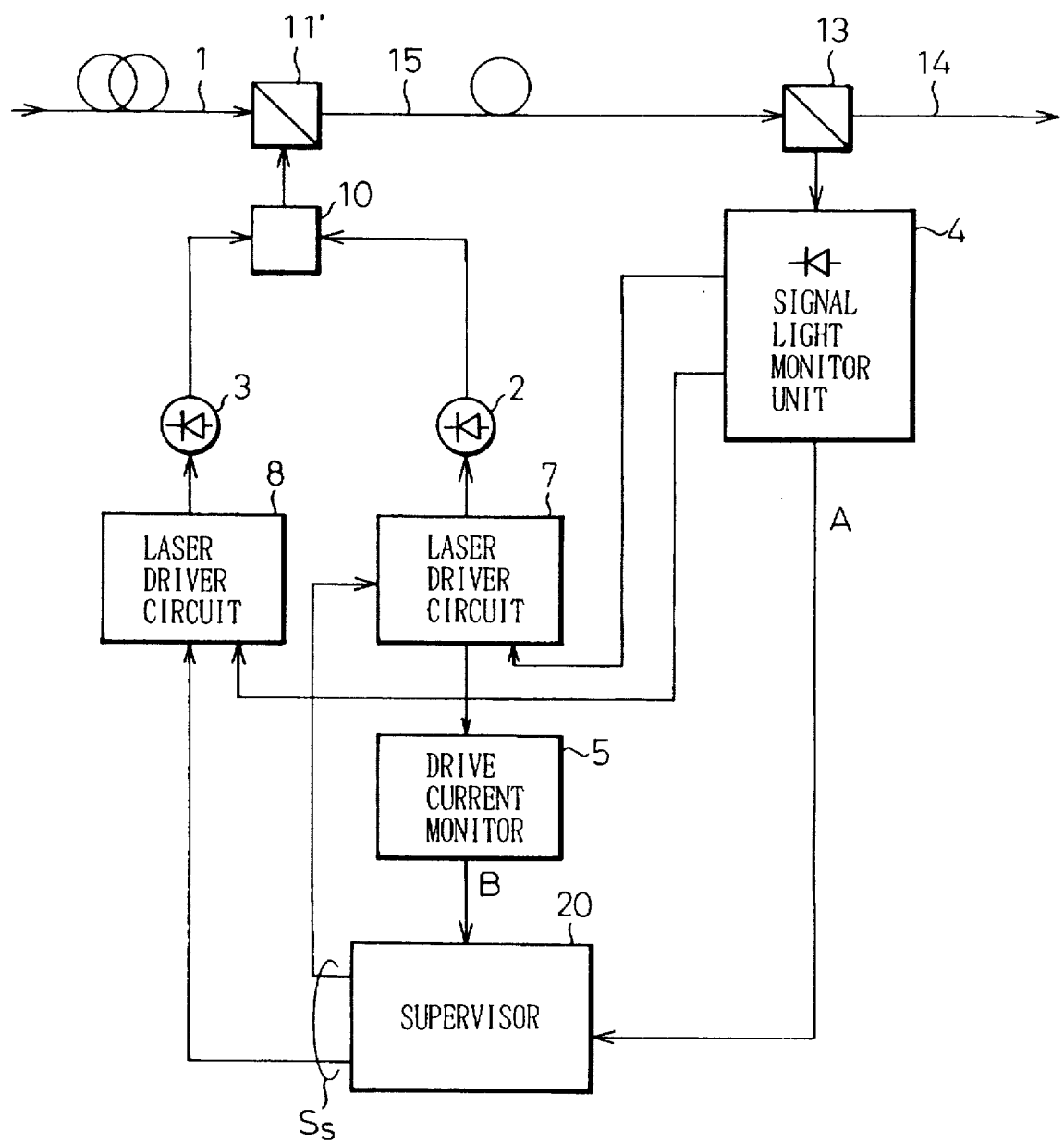
FIG. 9 is a view showing an example of the operation of the apparatus of the present invention under backward pumping.

FIG. 9 is a view showing an example of the operation of the apparatus of the present invention under backward pumping. The above explanation was made taking as an example the case of firing pumping light from the laser 2 or 3 from the input side of the optical amplifying fiber 1, but as shown in FIG. 9, the present invention can be applied in the case of firing the pumping light from the output side of the optical amplifying fiber 1 as well. In FIG. 9, the optical amplifying fiber 1 is placed at the left side of the optical coupler 11' and input signal light is fired from the left end of the fiber 1. At the left side of the optical coupler 11' is arranged an ordinary optical fiber 15.

Note that the working laser 2 and the stand-by laser 3 need not be semiconductor lasers, but may be other solid lasers, gaseous lasers, etc. as well. Further, the comparator circuit 22 may be shared between the working laser 2 side and the stand-by laser 3 side.

As explained above, the present invention splits off part of the output signal light and monitors it by the signal light monitor unit 4. Further, it monitors the drive current of the working laser 2 by the drive current monitor unit 5. When the monitor output signal of the signal light monitor unit 4 falls below a predetermined value and the monitor output signal of the drive current monitor unit 5 exceeds a predetermined range, it is judged that the working laser 2 has deteriorated or there is a fault in the driver unit of the working laser 2 and the stand-by laser 3 is switched to. The deterioration of the working laser 2 which generates the pumping light of the optical amplifying fiber 1 is supervised so accurate switching of the working and stand-by systems becomes possible. Therefore, there is the advantage of enabling an improvement in the reliability of the optical amplifier apparatus.

I claim:

1. An optical amplifier apparatus comprising an optical amplifying fiber, means for coupling pumping light with input signal light in the optical amplifying fiber, to amplify the input signal light, the apparatus further comprising:

a working laser which outputs said pumping light;

one or more stand-by lasers for use in place of the working laser;

a signal light monitor unit which splits part of output signal light optically amplified by the optical amplifying fiber and monitors the intensity of the same;

a drive current monitor unit which monitors the magnitude of a drive current for driving the working laser; and supervisory means which receive a first monitor output from said signal light monitor unit and a second monitor output from the drive current monitor unit and produces a working/stand-by switching command signal to switch between the working laser and the stand-by laser in accordance with the first and second monitor outputs;

wherein said supervisory means produce said working/stand-by switching command signal when it detects that the first monitor output falls below a first threshold ($TH_1$) and the second monitor output becomes larger than a second threshold ($TH_2$) or smaller than a third threshold ($TH_3$: $TH_2 > TH_3$); and said supervisory means comprises a first comparator circuit which receives as one input said first threshold ($TH_1$) and as another input said first monitor output, a second comparator circuit which receives as one input said second threshold ($TH_2$) and said third threshold ($TH_3$) and receives as another input said second monitor output, and a decision circuit which receives as input information the results of comparison from the first and second comparator circuits and issues said working/stand-by switching command signal under said input information.

2. An optical amplifier apparatus as set forth in claim 1, wherein said first comparator circuit outputs a first logic or a second logic in accordance with whether the first monitor output is over said first threshold ($TH_1$) and said second comparator circuit outputs a first logic or a second logic in accordance with whether the said second monitor output is between said second threshold ($TH_2$) and said third threshold ($TH_3$).

3. An optical amplifier apparatus as set forth in claim 2, wherein said decision circuit comprises of an AND circuit which receives as a first input said first logic or second logic from said first comparator circuit and receives as a second output said first logic or second logic from said second comparator circuit and sends said working/stand-by switching command signal by the output of the AND circuit.

4. An optical amplifier apparatus as set forth in claim 3, wherein a flip-flop is provided at the output stage of the AND circuit and said working/stand-by switching command signal is sent through said flip-flop.

5. An optical amplifier apparatus as set forth in claim 3, wherein said comparator circuit is composed of a first comparator which receives as one input said second threshold ($TH_2$), a second comparator which receives as one input said third threshold ($TH_3$), and an OR circuit, said second monitor output is received in common at the other inputs of the first and second comparators, and said OR circuit receives as its input the outputs of the first and second comparators and sends its output to the decision circuit.

6. An optical amplifier apparatus including an optical amplifying fiber, the apparatus coupling input signal light and pumping light into the optical amplifying fiber to amplify the input signal light, the apparatus further comprising:

a working laser connected to said optical amplifying fiber, said working laser outputting said pumping light;

a working laser driver connected to said working laser, said working laser driver supplying a drive current to said working laser;

a stand-by laser connected in parallel to said working laser, said stand-by laser outputting said pumping light when said stand-by laser is used in place of said working laser;

a stand-by laser driver connected to said stand-by laser, said stand-by laser driver supplying a drive current to said stand-by laser;

a signal light monitor unit connected to said optical amplifying fiber, said signal light monitor unit monitoring the intensity of light optically amplified by the optical amplifying fiber to produce a signal light output signal;

a drive current monitoring unit connected to said working laser driver; said drive current monitoring unit monitoring the magnitude of the drive current supplied to the working laser to produce a drive current output signal; and a supervisory unit connected to said working and stand-by drivers, said drive current monitoring unit and said signal light monitoring unit, said supervisory unit switching from said working laser to said stand-by laser when both said signal light output signal falls below a first predetermined threshold and said drive current output signal exceeds a second predetermined threshold.

7. An optical amplifier according to claim 6 further comprising:

a second stand-by laser connected parallel to said stand-by laser and said working laser; and a second drive current monitoring unit connected to said working laser; said second drive current monitoring unit monitoring the magnitude of the drive current of the stand-by laser to produce said drive current output signal when said stand-by laser is used in place of said working laser;

wherein said supervisory unit switches, when said stand-by laser is being used in place of said working laser as a working laser, from said stand-by laser to said second stand-by laser when when said signal light output signal falls below a first predetermined threshold and said drive current output signal exceeds a second predetermined threshold.

* * * * *

UNITED STATES PATENT AND TRADEMARK OFFICE
CERTIFICATE OF CORRECTION

PATENT NO. : 5,546,221
DATED : August 13, 1996
INVENTOR(S) : Harasawa

It is certified that error appears in the above-indentified patent and that said Letters Patent is hereby corrected as shown below:

Column 1, line 60, delete "Optical" and insert --optical--.

Column 6, line 63, delete "$TH_1$" and insert --$TH_3$--.

Column 8, line 56, delete "($TH_1$:" and insert --($TH_3$:--.

Column 10, line 38, after "when" delete "when".

Column 9, line 10, after "comprises" delete "of".

Column 9, line 20, delete "claim 3" and insert --claim 2--.

Signed and Sealed this

Fifteenth Day of July, 1997

Attest:

BRUCE LEHMAN

*Attesting Officer*  *Commissioner of Patents and Trademarks*